(12) United States Patent
Song

(10) Patent No.: US 9,892,772 B2
(45) Date of Patent: Feb. 13, 2018

(54) SEMICONDUCTOR SYSTEM AND METHOD OF PERFORMING WRITE LEVELING OPERATION THEREOF

(71) Applicant: SK hynix Inc., Gyeonggi-do (KR)

(72) Inventor: Keun-Soo Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/225,961

(22) Filed: Aug. 2, 2016

(65) Prior Publication Data
US 2017/0270982 A1   Sep. 21, 2017

(30) Foreign Application Priority Data

Mar. 16, 2016 (KR) .......................... 10-2016-0031483

(51) Int. Cl.
*G11C 7/22* (2006.01)
*G11C 7/10* (2006.01)

(52) U.S. Cl.
CPC . *G11C 7/22* (2013.01); *G11C 7/10* (2013.01)

(58) Field of Classification Search
CPC ....................................................... G11C 7/22
See application file for complete search history.

(56) References Cited

U.S. PATENT DOCUMENTS

| | | | |
|---|---|---|---|
| 7,590,008 B1 * | 9/2009 | Roge | G11C 5/04 365/189.011 |
| 7,746,723 B2 * | 6/2010 | Oh | G11C 7/1051 365/189.05 |
| 7,975,162 B2 * | 7/2011 | Kim | G11C 7/1078 365/219 |
| 8,775,701 B1 * | 7/2014 | Fung | G06F 1/12 365/189.011 |
| 8,917,113 B1 * | 12/2014 | Song | G01R 25/00 327/12 |
| 9,304,530 B1 * | 4/2016 | Ware | G06F 1/04 |
| 9,449,665 B1 * | 9/2016 | Kim | G11C 7/222 |
| 9,530,472 B1 * | 12/2016 | Park | G11C 7/1012 |
| 9,542,983 B1 * | 1/2017 | Kim | G11C 7/222 |
| 9,672,884 B1 * | 6/2017 | Han | G11C 7/1066 |
| 9,741,407 B2 * | 8/2017 | Kim | G11C 7/222 |

(Continued)

FOREIGN PATENT DOCUMENTS

| KR | 1020130070335 | 6/2013 |
|---|---|---|
| KR | 1020140147898 | 12/2014 |

(Continued)

*Primary Examiner* — Anthan Tran
*Assistant Examiner* — Mushfique Siddique
(74) *Attorney, Agent, or Firm* — IP & T Group LLP

(57) ABSTRACT

This technology relates to a semiconductor system. The semiconductor system may include a first semiconductor device capable of outputting a clock signal, a data strobe signal, and data; and a second semiconductor device capable of generating a division enable signal and a data input clock signal in response to the clock signal when performing a write operation, generating an internal strobe signal by dividing the data strobe signal in response to the division enable signal, and aligning the data in response to the internal strobe signal, wherein the first semiconductor device receives the division enable signal from the second semiconductor device and trains the data strobe signal so that the data strobe signal is output in a predetermined section.

15 Claims, 7 Drawing Sheets

(56) References Cited

U.S. PATENT DOCUMENTS

| | | | | |
|---|---|---|---|---|
| 2001/0000994 | A1* | 5/2001 | Tomita | G11C 7/1066 365/233.1 |
| 2007/0002644 | A1* | 1/2007 | Kang | G11C 7/1006 365/193 |
| 2007/0201286 | A1* | 8/2007 | Oh | G11C 7/1078 365/193 |
| 2008/0123445 | A1* | 5/2008 | Vergnes | G11C 29/02 365/194 |
| 2009/0077409 | A1* | 3/2009 | Matulik | G06F 13/1689 713/401 |
| 2009/0091987 | A1* | 4/2009 | Butt | G11C 7/1006 365/189.05 |
| 2009/0296501 | A1* | 12/2009 | Searles | G06F 13/1689 365/193 |
| 2011/0249521 | A1* | 10/2011 | Abe | G11C 7/22 365/193 |
| 2011/0267117 | A1* | 11/2011 | Choi | H03L 7/00 327/156 |
| 2012/0250434 | A1* | 10/2012 | Song | G11C 7/1093 365/193 |
| 2014/0334243 | A1* | 11/2014 | Duffner | G11C 7/00 365/233.13 |
| 2015/0063044 | A1* | 3/2015 | Byun | G11C 7/22 365/193 |
| 2015/0206560 | A1* | 7/2015 | Kang | G11C 7/1066 711/103 |
| 2015/0213861 | A1* | 7/2015 | Lee | G11C 7/222 365/189.05 |
| 2015/0256183 | A1* | 9/2015 | Park | G11C 7/222 327/115 |
| 2015/0378603 | A1* | 12/2015 | Dearth | G06F 13/4072 711/154 |
| 2016/0372173 | A1* | 12/2016 | Kim | G11C 7/222 |
| 2017/0084320 | A1* | 3/2017 | Kim | G11C 7/222 |
| 2017/0117031 | A1* | 4/2017 | Lee | G11C 11/4076 |

FOREIGN PATENT DOCUMENTS

| | | | | |
|---|---|---|---|---|
| KR | 20170013486 A | * | 2/2017 | G11C 7/222 |
| KR | 20170108464 A | * | 9/2017 | G11C 7/1093 |

\* cited by examiner

SEMICONDUCTOR SYSTEM AND METHOD OF PERFORMING WRITE LEVELING OPERATION THEREOF

CROSS-REFERENCE TO RELATED APPLICATION

The present application claims priority under 35 U.S.C. § 119(a) to Korean Patent Application No. 10-2016-0031483, filed on Mar. 16, 2016, which is incorporated herein by reference in its entirety.

BACKGROUND

1. Field

Exemplary embodiments of the present invention relate generally to a semiconductor design technology and, more particularly, to a semiconductor system configured to perform a write leveling operation and an operating method thereof.

2. Description of the Related Art

Generally, input of signals to a dynamic random access memory (DRAM) or a semiconductor circuit is performed using a clock signal of a semiconductor system. If the clock signal is changed by external and/or internal noise components, a signal input may become abnormal. Furthermore, if a clock signal margin is not secured due to incompleteness of a configuration circuit, the signal input may be recognized as an abnormal input signal, which may affect an output signal. In an existing system configuration, an abnormal output signal from a logic circuit cannot be determined, which may become the cause of a malfunction of another logic circuit using the abnormal output signal as an input signal. A case where whether the state of an abnormal output signal has a "high" level or "low" level cannot be determined is called a meta-stable state.

Continuous increases in the operating speed of semiconductor systems require higher speed, data transmission rate and lower power operation between semiconductor devices in the semiconductor systems. A common method for increasing the operating speed and reducing the power consumption of semiconductor devices has been to increase a frequency of a clock.

If the frequency of the clock is increased, a data strobe signal DQS is also increased with the same frequency. If the data strobe signal DQS with a high frequency cannot be used in a semiconductor device, the data strobe signal DQS is divided by a DQS frequency divider and used in the semiconductor device. The DQS frequency divider may use a division control signal generated based on a clock signal. The division control signal is sensitive to a change in the process, voltage, and temperature (PVT), and may be controlled so that it is enabled prior to a write preamble section. During the write preamble section the data strobe signal DQS maintains a low level for 1 clock before data is output. In this case, a problem may occur. This is described in detail with reference to FIG. 1.

FIGS. 1A to 1C are diagrams illustrating a meta-stable state.

FIG. 1A shows a DQS buffer circuit for buffering external data strobe signals DQS_t/DQS_c that are differentially inputted from an external device.

In FIG. 1A, the DQS buffer circuit may buffer the external data strobe signals DQS_t and DQS_c in response to a buffer enable signal BUFF_EN and output internal data strobe signals DS and DSB.

FIG. 1B shows a DQS frequency divider circuit for generating first to fourth data strobe signals IDQS, QDQS, IDQSB, and QDQSB having different phases by dividing the internal data strobe signals DS and DSB. FIG. 1B may include first and second flip-flops FF1 and FF2.

FIG. 1C is a timing diagram showing the operations of the DQS buffer circuit and the DQS frequency divider circuit shown in FIGS. 1A and 1B.

From FIG. 1C, it may be seen that the DQS buffer circuit and the DQS frequency divider circuit are enabled before the external data strobe signals DQS_t and DQS_c are inputted. In this case, if a noise is generated in a DQS channel (e.g., the Internal node DQS DVD_INT NODE of a DQS divider), the DQS buffer circuit amplifies the noise, and thus the DQS frequency divider circuit may malfunction due to the noise. In other words, when the noise is generated in the internal node DQS DVD_INT NODE of the DQS divider, the DQS frequency divider circuit enters into a meta-stable state. Accordingly, the DQS frequency divider circuit outputs a signal divided at an abnormal timing. As a result, there may be a problem in that a circuit using the divided data strobe signal malfunctions.

In order to solve such a problem, a division control signal may be controlled so that it is enabled in a write preamble section. However, in this case, there is a possibility that the DQS frequency divider circuit may enter the meta-stable state.

A training operation, such as write leveling, is required to control the division control signal so that it is enabled at a specific timing within a write preamble section. In general, in the performance specification of a semiconductor memory device, a domain crossing margin tDQSS between the data strobe signal and the clock signal is provided. Accordingly, the semiconductor memory device adopts a write leveling technology in which a skew between the data strobe signal and the clock signal is calibrated when performing a write operation. In such a write leveling operation, a phase between a clock signal and at least one of the strobe division signals based on a data strobe signal is detected, and the phase of the clock signal and the phase of an external data strobe signal are matched by controlling timing when the external data strobe signal is generated.

SUMMARY

Various embodiments are directed to the provision of a semiconductor system capable of preventing a meta-stable state by performing a write leveling operation.

In an embodiment, a semiconductor system may include a first semiconductor device capable of outputting a clock signal, a data strobe signal, and data; and a second semiconductor device capable of generating a division enable signal and a data input clock signal in response to the clock signal when performing a write operation, generating an internal strobe signal by dividing the data strobe signal in response to the division enable signal, and aligning the data in response to the internal strobe signal, wherein the first semiconductor device receives the division enable signal from the second semiconductor device and trains the data strobe signal so that the data strobe signal is output in a predetermined section.

The second semiconductor device may include the second semiconductor device may include a clock control unit capable of generating an internal clock signal by dividing the clock signal and generating the division enable signal and the data input clock signal in response to the internal clock signal when the write operation is performed; an internal strobe signal generation unit capable of generating the internal strobe signal by dividing the data strobe signal in response to the division enable signal, detecting a phase of the data input clock signal in response to part of the internal strobe signal, and generating a data input strobe signal; a data output control unit capable of aligning the data in response to the internal strobe signal and generating the aligned data as internal data in response to the data input strobe signal or the data input clock signal; and a latch unit capable of storing the division enable signal in response to the data strobe signal and externally outputting the stored division enable signal.

The clock control unit may include a mode control unit capable of controlling an operation mode in response to a command and the internal clock signal; and a data input clock generation unit capable of generating the division enable signal and the data input clock signal when the write operation is performed.

The clock control unit may further include a clock buffer capable of receiving and buffering the clock signal; and a clock division unit capable of generating the internal clock signal by dividing the buffered clock signal.

The internal strobe signal generation unit may include a strobe signal division unit capable of generating the internal strobe signal by dividing the data strobe signal in response to the division enable signal; and a data input strobe signal generation unit capable of detecting the phase of the data input clock signal and generating the data input strobe signal for generating the internal data in response to the internal strobe signal.

The internal strobe signal generation unit may further include a strobe signal buffer capable of receiving and buffering the data strobe signal; and a signal transfer unit capable of outputting the buffered data strobe signal in response to the division enable signal, wherein the strobe signal division unit generates the internal strobe signal by dividing the buffered data strobe signal in response to the division enable signal.

The data output control unit may include a data alignment unit capable of generating alignment data by aligning the data in response to the internal strobe signal; and an internal data generation unit capable of generating the internal data by latching the alignment data in response to the data input strobe signal or the data input clock signal.

The data output control unit may further include a data receiver capable of receiving the data in response to the internal strobe signal, wherein the data alignment unit generates the alignment data by aligning the received data in response to the internal strobe signal.

The second semiconductor device may further include a selection unit capable of selectively outputting the data input strobe signal or the data input clock signal in response to a test mode signal.

The first semiconductor device may further include a training unit capable of training the data strobe signal in response to the division enable signal so that the data strobe signal is inputted in the predetermined section.

The training unit may include a delay control unit capable of generating a delay control signal in response to a command; and a variable delay unit capable of generating a delayed data strobe signal by changing a delay time of the data strobe signal in response to the delay control signal.

The predetermined section may be a write preamble section.

The second semiconductor device may comprise a memory device, and the first semiconductor device may comprise a memory controller capable of controlling the memory device.

In an embodiment, an operating method of a semiconductor system may include generating an internal clock signal by dividing a clock signal; generating a division enable signal and a data input clock signal in response to the internal clock signal when performing a write operation; generating an internal strobe signal by dividing a data strobe signal in response to the division enable signal; and training the data strobe signal so that a point of time at which the division enable signal is enabled is included in a predetermined section.

The operating method may further include detecting a phase of the data input clock signal and generating a data input strobe signal in response to the internal strobe signal; and generating internal data in response to the data input strobe signal or the data input clock signal.

The generating of the internal data may comprise generating alignment data by aligning data in response to the internal strobe signal.

The training of the data strobe signal may comprise controlling a point of time at which the data strobe signal is inputted in response to the division enable signal.

The predetermined section may be a write preamble section.

The semiconductor system may include a first semiconductor device and a second semiconductor device, wherein the generating of the internal clock signal, the generating of the division enable signal and the data input clock signal, and the generating of the internal strobe signal are performed by the second semiconductor device, and wherein the training of the data strobe signal is performed by the first semiconductor device.

The second semiconductor device may comprise a memory device, and the first semiconductor device may comprise a memory controller capable of controlling the memory device.

BRIEF DESCRIPTION OF THE DRAWINGS

The above and other features and advantages of the present invention will become more apparent to those skilled in the art to which the present invention belongs by the following detailed description with reference to the attached drawings in which.

DETAILED DESCRIPTION

Figure 1A:
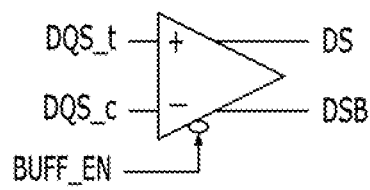
FIGS. 1A to 1C are diagrams illustrating a meta-stable state.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and Intervals for convenience of illustration.

It will be further understood that when an element is referred to as being "connected to", or "coupled to" another element, it may be directly on, connected to, or coupled to the other element, or one or more intervening elements may be present.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes", and "Including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Figure 2:
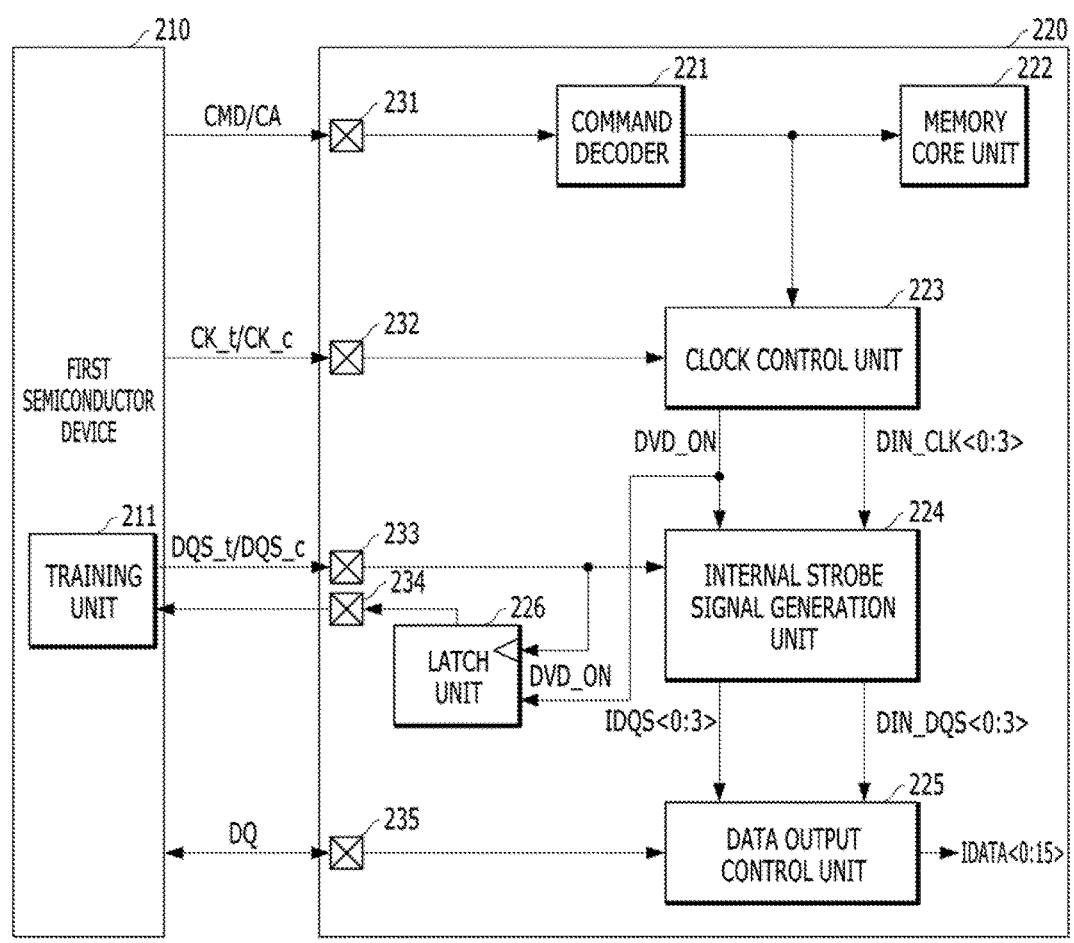
FIG. 2 is a block diagram illustrating a semiconductor system, comprising first and second semiconductor devices, according to an embodiment of the present invention.

FIG. 2 shows a semiconductor system, according to an embodiment of the present invention.

Referring to FIG. 2, the semiconductor system may include a first semiconductor device 210 and a second semiconductor device 220. The second semiconductor device 220 may be a memory device. The first semiconductor device 210 may be a memory controller for controlling the second semiconductor device 220.

The first semiconductor device 210 may apply an external command and column address CMD/CA, first and second clocks CK_t/CK_c, first and second data strobe signals DQS_t/DQS_c, and data DQ to the second semiconductor device 220. The first and the second data strobe signals DQS_t/DQS_c may be toggled during the section from a point of time at which a write operation is initiated to a point of time at which the write operation is terminated after a point of time at which a predetermined section (e.g., write latency) has elapsed.

The first semiconductor device 210 may include a training unit 211.

The training unit 211 may delay the data strobe signals DQS_t/DQS_c in order to train the data strobe signals DQS_t/DQS_c between the second semiconductor device 220 and the first semiconductor device 210, and may output delayed signals. In other words, the training unit 211 may be formed of a programmable delay circuit. In this case, the delay amount may be controlled based on a point of time at which a division enable signal DVD_ON generated by the second semiconductor device 220 is enabled. The training unit 211 may be implemented in various ways.

The second semiconductor device 220 may include a command decoder 221, a memory core unit 222, a clock control unit 223, an internal strobe signal generation unit 224, a data output control unit 225, and a latch unit 226.

The command decoder 221 may receive the command and column address CMD/CA from an external device through a first pad 231 and decode the received command CMD.

The memory core unit 222 may perform an internal operation in response to the command CMD decoded and outputted by the command decoder 221.

The clock control unit 223 may receive the first and the second clock signals CK_t/CK_c from the external device through a second pad 232, may generate internal clock signals (not shown) by dividing the received clock signals CK_t/CK_c, and may generate the division enable signal DVD_ON and data input clock signals DIN_CLK<0:3> in response to the internal clock signals and the command and column address CMD/CA decoded and outputted by the command decoder 221. In this case, the division enable signal DVD_ON and the data output signals DIN_CLK<0:3> may be generated in response to the Internal clock signals according to control of internal mode when a write operation is performed.

The internal strobe signal generation unit 224 may generate internal strobe signals IDQS<0:3> by dividing the data strobe signals DQS_t/DQS_c, received from the external device through a third pad 233, in response to the division enable signal DVD_ON. Furthermore, the internal strobe signal generation unit 224 may detect the phase of the data input clock signals DIN_CLK<0:3> in response to the internal strobe signals IDQS<0:3>, and may generate data input strobe signals DIN_DQS<0:3>. The latch unit 226 may latch the division enable signal DVD_ON in response to the data strobe signals DQS_t/DQS_c received from the external device and transfer the latched signal to the training unit 211 through a fourth pad 234.

The data output control unit 225 may receive the data DQ from the external device through a fifth pad 235, align the received data DQ in response to the internal strobe signals IDQS<0:3>, and may output the aligned data as internal data IDATA<0:15> in response to the data input strobe signals DIN_DQS<0:3>.

Figure 3:
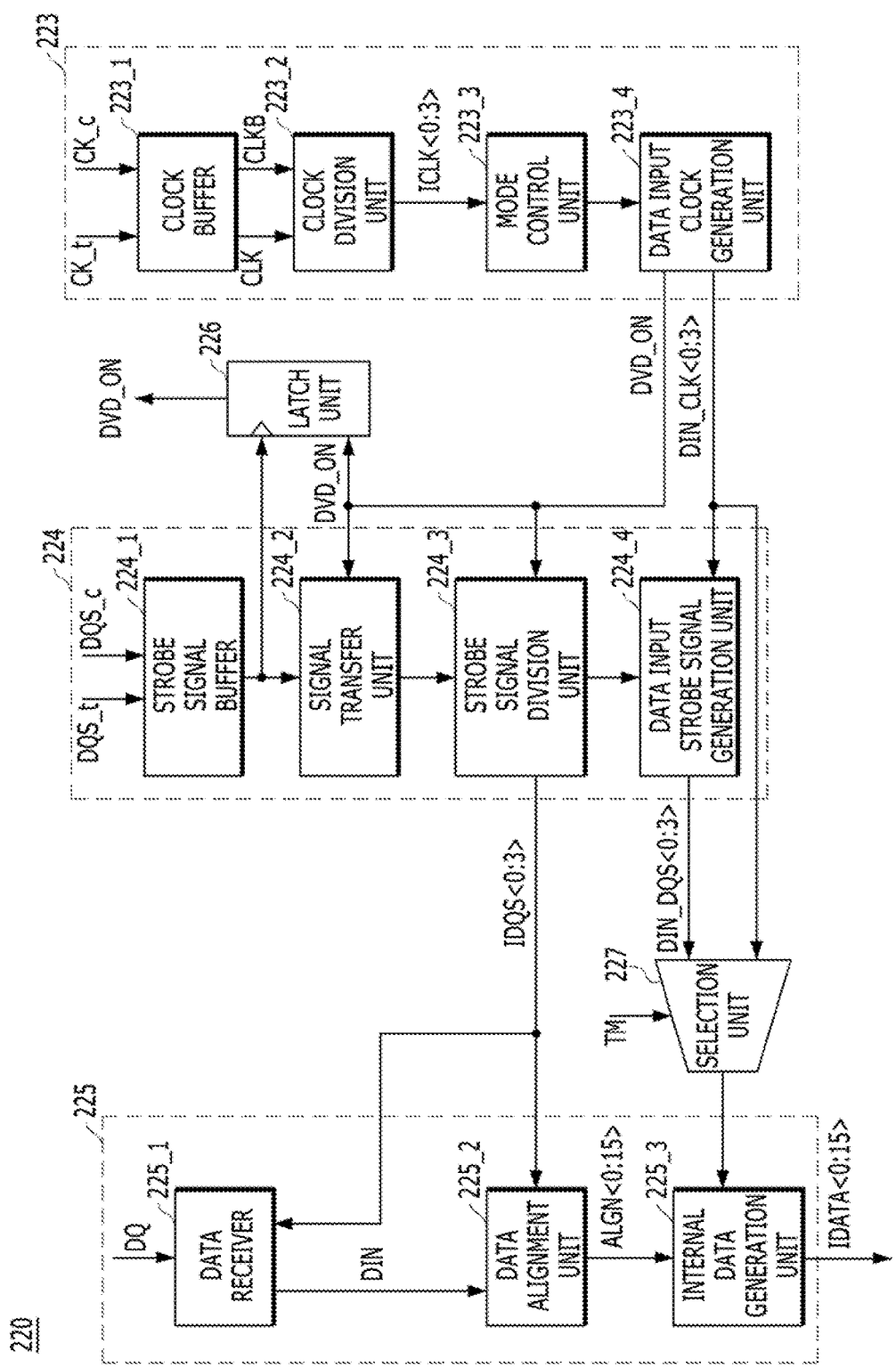
FIG. 3 is a block diagram illustrating an example of a more detailed configuration of the second semiconductor device of the semiconductor system of FIG. 2.

FIG. 3 shows the second semiconductor device 220 of FIG. 2.

Referring to FIG. 3, the second semiconductor device 220 may include a clock control unit 223, an internal strobe signal generation unit 224, a data output control unit 225, a latch unit 226, and a selection unit 227. It is noted that a command decoder 221 and a memory core unit 222 shown in FIG. 2 are not illustrated herein for avoiding overcrowding FIG. 3.

The clock control unit 223 may generate internal clock signals ICLK<0:3> by dividing the clock signals CK_t and CK_c received from an external device. Further, the clock control unit 223 may generate the data input clock signals DIN_CLK<0:3> and the division enable signal DVD_ON according to an operation mode.

The clock control unit 223 may include a clock buffer 223_1, a clock division unit 223_2, a mode control unit 223_3, and a data input clock generation unit 223_4.

The clock buffer 223_1 may receive the external clock signals CK_t and CK_c and perform a buffering operation for the received external clock signals CK_t and CK_c.

The clock division unit 223_2 may generate a plurality of internal clock signals ICLK<0:3> having different phases by dividing the buffered clock signals CK_t and CK_c. For example, the plurality of internal clock signals ICLK<0:3> may include a first internal clock signal ICLK, a second internal clock signal QCLK, a third internal clock signal ICLKB, and a fourth internal clock signal QCLKB. Each of the first internal clock signal ICLK, the second internal clock signal QCLK, the third internal clock signal ICLKB, and the fourth internal clock signal QCLKB may be formed to have a cycle two times greater than the external clock signals CK_t and CK_c. Furthermore, the first internal clock signal ICLK, the second internal clock signal QCLK, the third internal clock signal ICLKB, and the fourth internal clock signal QCLKB may be configured to have a phase difference of 90° between adjacent internal clock signals. In other words, the first internal clock signal ICLK and the second internal clock signal QCLK may have a phase difference of 90°, the second internal clock signal QCLK and the third internal clock signal ICLKB may have a phase difference of 90°, the third internal clock signal ICLKB and the fourth internal clock signal QCLKB may have a phase difference of 90°, and the fourth internal clock signal QCLKB and the first internal clock signal ICLK may have a phase difference of 90°. The first internal clock signal ICLK and the third internal clock signal ICLKB may be configured to have opposite phases (i.e., a phase difference of 180°), and the second internal clock signal QCLK and the fourth internal clock signal QCLKB may be configured to have opposite phases (I.e., a phase difference of 180°).

The mode control unit 223_3 may output a clock signal according to an operation mode in response to the plurality of internal clock signals ICLK<0:3> and the command and column address CMD/CA (not shown).

The data input clock generation unit 223_4 may generate the plurality of data input clock signals DIN_CLK<0:3> and the division enable signal DVD_ON in response to the clock signal output by the mode control unit 223_3. In this case, the plurality of data input clock signals DIN_CLK<0:3> may be clock signals for generating internal data, and the division enable signal DVD_ON may be an enable signal for dividing the data strobe signals DQS_t and DQS_c.

The internal strobe signal generation unit 224 may generate the plurality of internal strobe signals IDQS<0:3> by dividing the data strobe signal DQS_t and the inverted data strobe signal DQS_c in response to the division enable signal DVD_ON. Further, the internal strobe signal generation unit 224 may generate the data input strobe signals DIN_DQS<0:3> for generating internal data in response to the divided internal strobe signals IDQS<0:3>.

The Internal strobe signal generation unit 224 may include a strobe signal buffer 224_1, a signal transfer unit 224_2, a strobe signal division unit 224_3, and a data input strobe signal generation unit 224_4.

The strobe signal buffer 224_1 may buffer the data strobe signal DQS_t and the inverted data strobe signal DQS_c received from the external device and output the buffered signals.

The signal transfer unit 224_2 may transfer the data strobe signal DQS_t and inverted data strobe signal DQS_c, buffered and transmitted by the strobe signal buffer 224_1, to the strobe signal division unit 224_3 in response to the division enable signal DVD_ON. The signal transfer unit 224_2 may be implemented, for example, with an AND gate.

The strobe signal division unit 224_3 may generate the plurality of internal strobe signals IDQS<0:3> by dividing the buffered data strobe signal DQS_t and inverted strobe signal DQS_c. The plurality of internal strobe signals IDQS<0:3> may include a first internal strobe signal IDQS, a second internal strobe signal QDQS, a third internal strobe signal IDQSB, and a fourth internal strobe signal QDQSB. The first internal strobe signal IDQS, the second internal strobe signal QDQS, the third internal strobe signal IDQSB, and the fourth internal strobe signal QDQSB may be configured to have a phase difference of 90° between adjacent internal clock signals. In other words, the first internal clock signal ICLK and the second internal clock signal QCLK may have a phase difference of 90°, the second internal clock signal QCLK and the third internal clock signal ICLKB may have a phase difference of 90°, the third internal clock signal ICLKB and the fourth internal clock signal QCLKB may have a phase difference of 90°, and the fourth internal clock signal QCLKB and the first internal clock signal ICLK may have a phase difference of 90°. The first internal strobe signal IDQS and the third internal strobe signal IDQSB may be configured to have opposite phases (i.e., a phase difference of 180°), and the second internal strobe signal QDQS and the fourth internal strobe signal QDQSB may be configured to have opposite phases (i.e., a phase difference of 180°). The phases and cycles of the first to the fourth internal strobe signals IDQS, QDQS, IDQSB, and QDQSB may be configured in various ways according to various embodiments.

The data input strobe signal generation unit 224_4 may generate the data input strobe signals DIN_DQS<0:3> for generating internal data IDATA<0:15> in response to the first to the fourth data input clock signals DIN_CLK<0:3> and the first to the fourth internal strobe signals IDQS<0:3>.

The data output control unit 225 may include a data receiver 225_1, a data alignment unit 225_2, and an internal data generation unit 225_3.

The data receiver 225_1 may receive the data DQ from the external device through a pad (not shown) and output the received data as input data DIN to the data alignment unit 225_2, in response to the plurality of internal strobe signals IDQS<0:3>.

The data alignment unit 225_2 may generate a plurality of alignment data ALGN<0:15> by aligning the input data DIN in response to the plurality of internal strobe signals IDQS<0:3>. A method for aligning the internal data DIN may be implemented by the data alignment unit 225_2, in various ways according to various embodiments.

The latch unit 226 may latch the division enable signal DVD_ON in response to the strobe signals DQS_t and DQS_c buffered and transmitted by the strobe signal buffer 224_1. Furthermore, the latch unit 226 may output the latched division enable signal DVD_ON to an external device. The external device may be a semiconductor controller (not shown) such as the first semiconductor device 210 in FIG. 2.

The internal data generation unit 225_3 may receive the alignment data ALGN<0:15> and generate a plurality of internal data IDATA<0:15> in response to the data input strobe signals DIN_DQS<0:3> or the data input clock signals DIN_CLK<0:3>. The plurality of internal data IDATA<0:15> generated by the internal data generation unit 225_3 may be transferred to a global input/output line (GIO).

The selection unit 227 may selectively output the data input strobe signals DIN_DQS<0:3> or the data input clock signals DIN_CLK<0:3> in response to a test mode signal TM. The data input strobe signals DIN_DQS<0:3> and the data input clock signals DIN_CLK<0:3> have almost no phase difference. Accordingly, any one of the data input strobe signals DIN_DQS<0:3> and the data input clock signals DIN_CLK<0:3> may be used to generate the internal data IDATA<0:15> by the internal data generation unit 225_3. The data input strobe signals DIN_DQS<0:3> or the data input clock signals DIN_CLK<0:3> may be selectively used as signals for generating the internal data IDATA<0:15> depending on an external user's option.

The operation of the semiconductor system is described below with reference to FIGS. 2 and 3.

The semiconductor system may perform a write leveling operation through the aforementioned configuration. In the write leveling operation, write leveling mode may be set through the mode control unit 223_3. This may be an operation for setting a proper phase between a clock signal and a data strobe signal.

The division enable signal DVD_ON generated by the data input clock generation unit 2234 is generated based on the clock signals CK_t and CK_c. A point of time at which the external data strobe signals DQS_t and DQS_c are inputted may be trained in response to the division enable signal DVD_ON.

The division enable signal DVD_ON may be stored in the latch unit 226 in response to the initially inputted data strobe signals DQS_t and DQS_c. The stored division enable signal DVD_ON may be transferred to an external device, for example, a semiconductor controller (not shown). The semiconductor controller may be the first semiconductor device 210 in FIG. 2. The semiconductor controller may receive the division enable signal DVD_ON, and may set an optimal point of time at which the data strobe signals DQS_t and DQS_c are inputted by continuously training the point of time.

In general, the second and the fourth internal strobe signals QDQS and QDQSB of the internal strobe signals generated by the strobe signal division unit 224_3 require a matching delay in order to secure a domain crossing margin tDQSS. In this case, the domain crossing margin tDQSS may be defined as q0.5tCK. Accordingly, a circuit for a write leveling operation may be included in the data input strobe signal generation unit 224_4.

The semiconductor device according to an embodiment of the present invention does not include a matching delay circuit. The semiconductor device may instead include the latch unit 226. Accordingly, the semiconductor device may secure the domain crossing margin tDQSS by controlling a point of time at which the data strobe signals DQS_t and DQS_c are inputted in response to the division enable signal DVD_ON through direct training with the semiconductor controller. In this case, the point of time at which the data strobe signals DQS_t and DQS_c are inputted may be a write preamble section tWPRE. Accordingly, a load of the semiconductor device can be reduced because the input data strobe signal generation unit 224 does not need to have a circuit for a write leveling operation.

Figure 4:
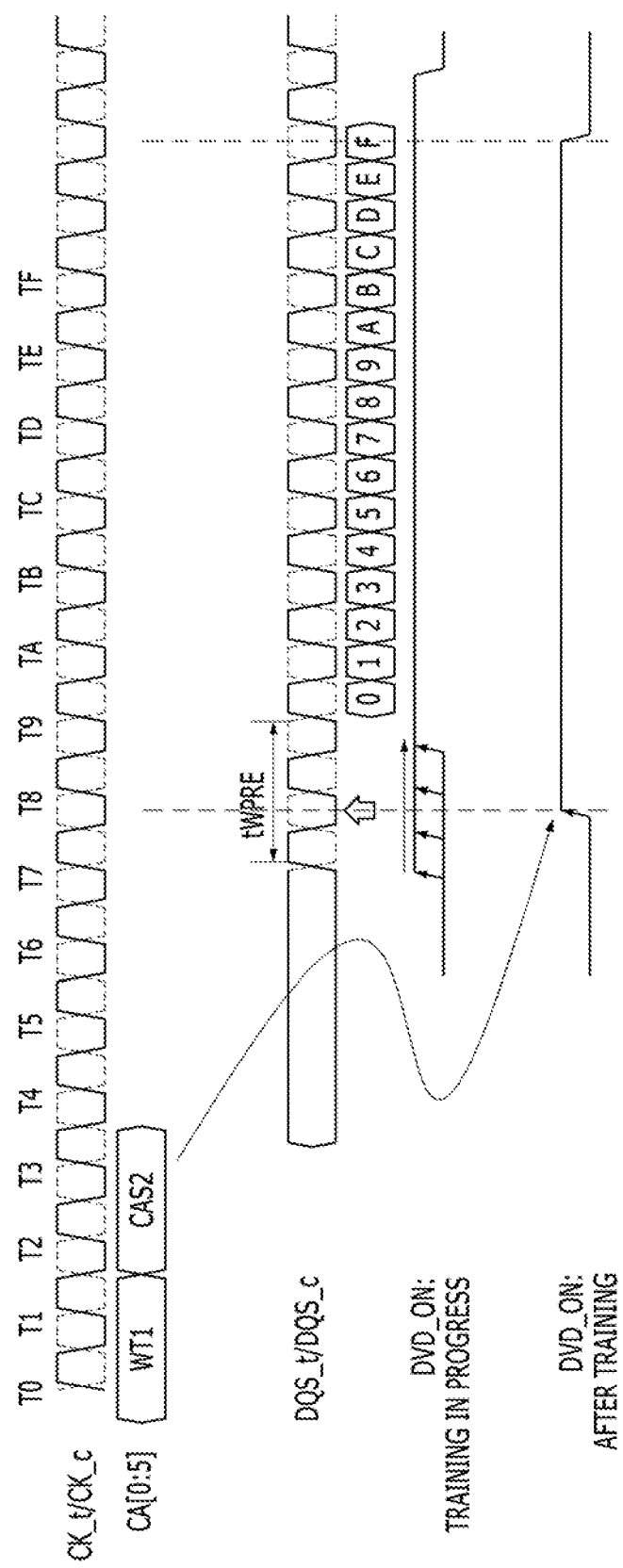
FIG. 4 is a timing diagram illustrating a training operation of the semiconductor system of FIG. 2.

FIG. 4 is a timing diagram illustrating the training operation of the semiconductor system of FIG. 2.

Referring to FIG. 4, the clock signals CK_t/CK_c may be inputted from the first semiconductor device 210 to the second semiconductor device 220, and a write command WT1 and a column command CAS2 may be inputted as a combination of the column addresses CA<0:5>.

Thereafter, the data input clock generation unit 223_4 may generate the division enable signal DVD_ON. An enable point of time may be set through a training operation. Such a training operation may be performed during a write preamble section tWPRE. The division enable signal DVD_ON may be trained so that it is enabled at the middle point of the data strobe signals DQS_c and DQS_t. From the timing diagram of FIG. 4, it may look like that a point of time at which the division enable signal DVD_ON is enabled is controlled. However, the division enable signal DVD_ON may be a fixed signal generated by the data input clock generation unit 223_4, and is trained so that the data strobe signals DQS_t and DQS_c are synchronized with a point of time at which the division enable signal DVD_ON is enabled.

Accordingly, a meta-stable state which may occur in the strobe signal division unit 223 can be prevented by setting the division enable signal DVD_ON so that it is enabled in the write preamble section tWPRE through such a training operation.

Figure 5:
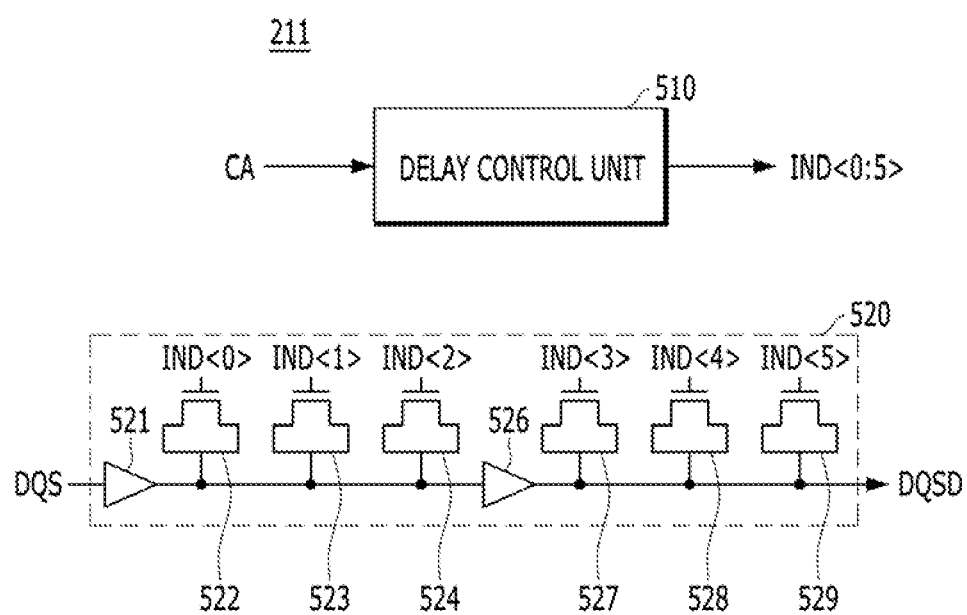
FIG. 5 is a circuit diagram of a training unit of the semiconductor system FIG. 2.

FIG. 5 is a circuit diagram of the training unit 211 included in the second semiconductor device 220 of FIG. 2.

Referring to FIG. 5, the training unit 211 may include a programmable delay circuit. The training unit 211 may include a delay control unit 510 and a variable delay unit 520.

The delay control unit 510 may generate delay control signals IND<0:5> in response to a column address signal CA. The delay control signals IND<0:5> may include a plurality of codes. The delay control unit 510 may sequentially increase or decrease the code values of the delay control signals IND<0:5> in response to the column address signal CA. The delay control unit 510 may use a thermometer encoder capable of sequentially increasing or decreasing the code values of the delay control signals IND<0:5> in response to the column address signal CA.

The variable delay unit 520 may change the delay time of a data strobe signal DQS in response to the delay control signals IND<0:5> and generate a delayed data strobe signal DQSD. The variable delay unit 520 may include a plurality of buffers 521 and 526 and a plurality of MOS capacitors 522, 523, 524, 527, 528, and 529. The first buffer 521 may receive the data strobe signal DQS through its input stage.

The output stage of the first buffer 521 may be coupled to the input stage of the second buffer 526. The second buffer 526 may output the delayed data strobe signal DQSD through its output stage.

The plurality of MOS capacitors 522, 523, 524, 527, 528, and 529 may receive the delay control signals IND<0:5> allocated thereto, respectively. The first MOS capacitor 522 may receive the first code IND<0> of the delay control signal. The second to the sixth MOS capacitors 523, 524, 527, 528, and 529 may receive the second to the sixth codes IND<1>-IND<5> of the delay control signals, respectively. The first to the third MOS capacitors 522, 523, and 524 may be coupled to the output stage of the first buffer 521. The fourth to the sixth MOS capacitors 527, 528, and 529 may be coupled to the output stage of the second buffer 526. When being turned on, the first to the sixth MOS capacitors 522, 523, 524, 527, 528, and 529 may increase the delay time of the variable delay unit 520 by increasing a load of the output stages of the first and the second buffers 521 and 526.

In the described embodiment of the present invention of FIG. 5, the variable delay unit 520 has been illustrated as having 6 MOS capacitors. However, the number of MOS capacitors and the number of codes of the delay control signals may be freely changed.

Figure 6:
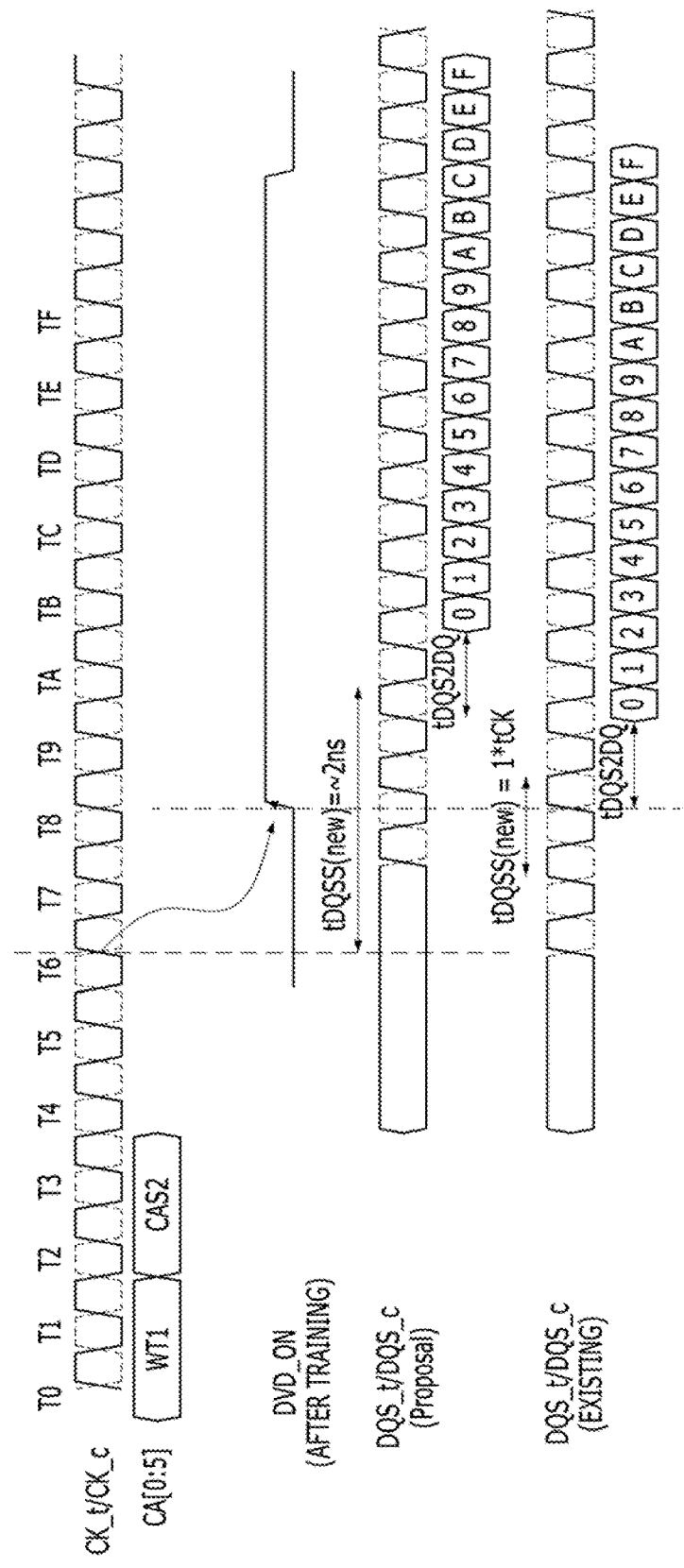
FIG. 6 is a timing diagram illustrating a comparison between a conventional domain crossing margin tDQSS and a domain crossing margin tDQSS, according to an embodiment of the present invention.

FIG. 6 is a timing diagram illustrating a comparison between a conventional domain crossing margin tDQSS and a domain crossing margin tDQSS according to an embodiment of the present invention.

Figure 1B:
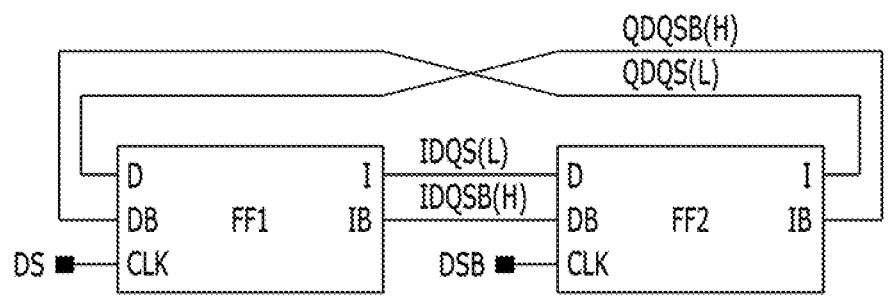
Figure 1C:
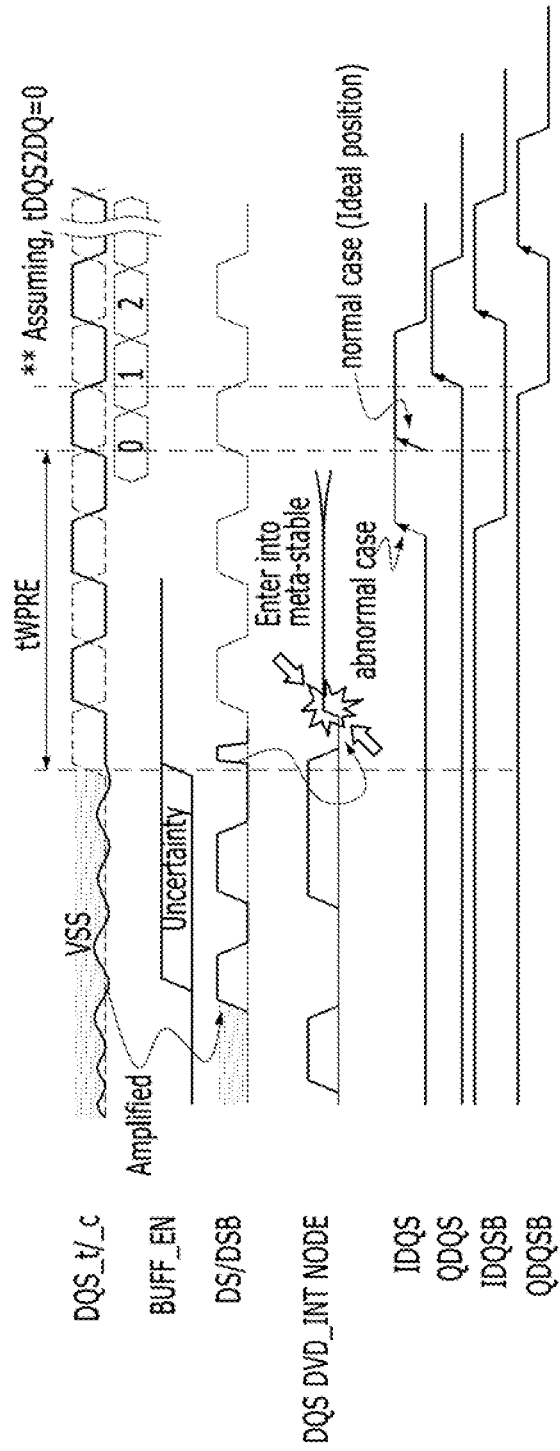

Referring to FIG. 6, the conventional domain crossing margin tDQSS is limited to 1 tCK, and the division enable signal DVD_ON is enabled (not shown) prior to the write preamble section. Accordingly, a semiconductor device may malfunction because a meta-stable state is generated as described with reference to FIG. 1.

According to an embodiment of the present invention, however, a domain crossing margin tDQSS of a maximum of 2 ns can be secured by controlling a point of time at which the data strobe signals DQS_t/DQS_c are inputted based on a point of time at which the division enable signal DVD_ON is enabled through a training operation.

In other words, the semiconductor system according to an embodiment of the present invention does not include a matching delay circuit for securing a domain crossing margin tDQSS in the second semiconductor device 220, that is, a memory device, and performs a write leveling operation. Accordingly, the delay of the memory device is reduced, and thus an equal load reduction is obtained as well. Furthermore, a point of time at which the division enable signal DVD_ON is enabled is set so that it is placed in the write preamble section tWPRE through a training operation. Accordingly, the domain crossing margin tDQSS can be stably secured compared to a related art, and thus a memory device that is safe in the meta-stable state can be designed.

Since a matching delay circuit unit is removed from a memory device, delay remains intact through the delay operation of the training unit 211 of the first semiconductor device 210 in FIG. 2 (e.g., a memory controller) by the reduced delay of the memory device. Accordingly, the amount of current of the entire system may not be changed. That is, the amount of current of the entire system can be controlled so that it is not changed, and a memory device safe in the meta-stable state can be designed.

According to embodiments of the semiconductor system of the present invention, the meta-stable state can be prevented by sufficiently securing the domain crossing margin tDQSS through a write leveling operation not including a matching delay operation.

Although various embodiments have been described for illustrative purposes, it will be apparent to those skilled in the art that various changes and modifications may be made without departing from the spirit and scope of the Invention as defined in the following claims.

What is claimed is:

1. A semiconductor system, comprising:
a first semiconductor device that outputs a clock signal, a data strobe signal, and data; and
a second semiconductor device that generates a division enable signal and a data input clock signal in response to the clock signal when performing a write operation, generates an internal strobe signal by dividing the data strobe signal in response to the division enable signal, and aligns the data in response to the internal strobe signal,
wherein the first semiconductor device receives the division enable signal from the second semiconductor device and trains the data strobe signal so that the data strobe signal is output in a write preamble section, and
wherein the second semiconductor device comprises a latch unit that stores the division enable signal in response to the data strobe signal and externally outputs the stored division enable signal to the first semiconductor device,
wherein the second semiconductor device comprises:
a clock control unit that generates an internal clock signal by dividing the clock signal and generates the division enable signal and the data input clock signal in response to the internal clock signal when the write operation is performed;
an internal strobe signal generation unit that generates the internal strobe signal by dividing the data strobe signal in response to the division enable signal, detects a phase of the data input clock signal in response to part of the internal strobe signal, and generates a data input strobe signal; and
a data output control unit that aligns the data in response to the internal strobe signal and generates the aligned data as internal data in response to the data input strobe signal or the data input clock signal.

2. The semiconductor system of claim 1, wherein the clock control unit comprises:
a mode control unit that controls an operation mode in response to a command and the internal clock signal; and
a data input clock generation unit that generates the division enable signal and the data input clock signal when the write operation is performed.

3. The semiconductor system of claim 2, wherein the clock control unit further comprises:
a clock buffer that receives to buffer the clock signal; and
a clock division unit that generates the internal clock signal by dividing the buffered clock signal.

4. The semiconductor system of claim 1, wherein the internal strobe signal generation unit comprises:
a strobe signal division unit that generates the internal strobe signal by dividing the data strobe signal in response to the division enable signal; and
a data input strobe signal generation unit that detects the phase of the data input clock signal and generates the data input strobe signal for generating the internal data in response to the internal strobe signal.

5. The semiconductor system of claim 4, wherein the internal strobe signal generation unit further comprises:
 a strobe signal buffer that receives to buffer the data strobe signal; and
 a signal transfer unit that outputs the buffered data strobe signal in response to the division enable signal,
 wherein the strobe signal division unit generates the internal strobe signal by dividing the buffered data strobe signal in response to the division enable signal.

6. The semiconductor system of claim 1, wherein the data output control unit comprises:
 a data alignment unit that generates alignment data by aligning the data in response to the internal strobe signal; and
 an internal data generation unit that generates the internal data by latching the alignment data in response to the data input strobe signal or the data input clock signal.

7. The semiconductor system of claim 6, wherein the data output control unit further comprises:
 a data receiver that receives the data in response to the internal strobe signal,
 wherein the data alignment unit generates the alignment data by aligning the received data in response to the internal strobe signal.

8. The semiconductor system of claim 1, wherein the second semiconductor device further comprises a selection unit that selectively outputs the data input strobe signal or the data input clock signal in response to a test mode signal.

9. The semiconductor system of claim 1, wherein the first semiconductor device further comprises a training unit that trains the data strobe signal in response to the division enable signal so that the data strobe signal is inputted in the write preamble section.

10. The semiconductor system of claim 9, wherein the training unit comprises:
 a delay control unit that generates a delay control signal in response to a command; and
 a variable delay unit that generates a delayed data strobe signal by changing a delay time of the data strobe signal in response to the delay control signal.

11. The semiconductor system of claim 1, wherein:
 the second semiconductor device comprises a memory device, and
 the first semiconductor device comprises a memory controller that controls the memory device.

12. An operating method of a semiconductor system including a memory controller device and a memory device, comprising:
 generating an internal clock signal by dividing a clock signal;
 generating a division enable signal and a data input clock signal in response to the internal clock signal when performing a write operation;
 generating an internal strobe signal by dividing a data strobe signal in response to the division enable signal;
 training the data strobe signal so that a point of time at which the division enable signal is enabled is included in a write preamble section;
 detecting a phase of the data input clock signal and generating a data input strobe signal in response to the internal strobe signal; and
 generating internal data in response to the data input strobe signal or the data input clock signal,
 wherein the division enable signal is stored in a latch unit of the memory device and externally outputted in response to the data strobe signal to the memory controller.

13. The operating method of claim 12, wherein the generating of the internal data comprises generating alignment data by aligning data in response to the internal strobe signal.

14. The operating method of claim 12, wherein the training of the data strobe signal comprises:
 controlling a point of time at which the data strobe signal is inputted in response to the division enable signal.

15. The operating method of claim 12, wherein the generating of the internal clock signal, the generating of the division enable signal and the data input clock signal, and the generating of the internal strobe signal are performed by the memory device, and wherein the training of the data strobe signal is performed by the memory controller.

* * * * *